US011308861B2

(12) United States Patent
Li (10) Patent No.: US 11,308,861 B2
(45) Date of Patent: Apr. 19, 2022

(54) DRIVING BACKPLANE, DISPLAY PANEL AND DISPLAY DEVICE (71) Applicant: BOE TECHNOLOGY GROUP CO., LTD., Beijing (CN)

(72) Inventor: Haixu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 16/899,620

(22) Filed: Jun. 12, 2020

(65) Prior Publication Data

US 2021/0027698 A1 Jan. 28, 2021

(30) Foreign Application Priority Data

Jul. 26, 2019 (CN) .......................... 201910683539.4

(51) Int. Cl.
*G09G 3/32* (2016.01)
*H01L 33/38* (2010.01)
*H01L 33/62* (2010.01)

(52) U.S. Cl.
CPC ............. *G09G 3/32* (2013.01); *H01L 33/387* (2013.01); *H01L 33/62* (2013.01); *G09G 2330/00* (2013.01)

(58) Field of Classification Search
CPC ..... H01L 33/387; H01L 33/62; H01L 25/167; H01L 25/0753; H01L 2933/0066; G09G 3/32; G09G 2330/00
See application file for complete search history.

(56) References Cited

U.S. PATENT DOCUMENTS

| 8,794,501 | B2* | 8/2014 | Bibl | ........................ H01L 33/30 |
| | | | | 228/179.1 |
| 9,153,341 | B2* | 10/2015 | Umezaki | .............. G09G 3/3648 |
| 11,112,897 | B2* | 9/2021 | Chen | ................... H01L 51/5253 |
| 2012/0223875 | A1* | 9/2012 | Lau | ....................... H01L 27/156 |
| | | | | 345/83 |
| 2013/0056736 | A1* | 3/2013 | Kim | ..................... G09G 3/3677 |
| | | | | 257/59 |
| 2018/0342691 | A1* | 11/2018 | Lu | ....................... H01L 25/0753 |
| 2019/0035993 | A1* | 1/2019 | Palaniswamy | .......... H01L 33/62 |
| 2019/0051792 | A1* | 2/2019 | Lo | .......................... H01L 25/167 |
| 2019/0181362 | A1* | 6/2019 | Tian | ....................... B32B 3/266 |
| 2019/0295992 | A1* | 9/2019 | Ahmed | ................. H01L 33/007 |

(Continued)

*Primary Examiner* — Vinh T Lam
(74) *Attorney, Agent, or Firm* — Calfee, Halter & Griswold LLP (57) ABSTRACT

The present disclosure provides a driving backplane, including: a base substrate, a driving circuit arranged on the base substrate, an insulation layer on a side of the driving circuit facing away from the base substrate, a plurality of first tip structures arranged on a side of the insulation layer facing away from the base substrate, and a plurality of contact electrodes arranged on the side of the insulation layer facing away from the base substrate. The driving circuit includes a plurality of output terminals, the insulation layer includes a plurality of openings and the output terminals and the openings are in a one-to-one correspondence. The contact electrodes are electrically connected with the output terminals through the openings. Each of the contact electrodes covers the plurality of first tip structures to constitute a plurality of second tip structures having the same appearance as the first tip structures.

13 Claims, 5 Drawing Sheets

(56) References Cited

U.S. PATENT DOCUMENTS

| | | | | |
|---|---|---|---|---|
| 2020/0144239 A1* | 5/2020 | Chang | ................... | H01L 27/156 |
| 2020/0225828 A1* | 7/2020 | Jeong | .................... | G06F 3/0443 |
| 2020/0395423 A1* | 12/2020 | Ahmed | ................... | H01L 33/44 |
| 2021/0066267 A1* | 3/2021 | Li | ........................ | H01L 27/124 |
| 2021/0135044 A1* | 5/2021 | Zou | .................... | H01L 21/7813 |
| 2021/0151418 A1* | 5/2021 | Zou | ................... | H01L 21/67712 |

* cited by examiner

DRIVING BACKPLANE, DISPLAY PANEL AND DISPLAY DEVICE

CROSS-REFERENCE TO RELATED APPLICATIONS

This application claims priority to Chinese Patent Application No. 201910683539.4, filed on Jul. 26, 2019, the entire content thereof is incorporated herein by reference.

TECHNICAL FIELD

The present disclosure relates to the field of display technologies and, more particularly, to a driving backplane, a display panel and a display device.

BACKGROUND

With the development of Light-Emitting Diode (LED), the Micro-Light-Emitting Diode (Micro-LED) display technology will become a next-generation revolutionary technology. Compared with the Organic Light-Emitting Diode (OLED), the Micro-LED display has a higher brightness, a better luminous efficiency, and lower power consumption.

At present, when a micro light-emitting diode is bound to a driving backplane, that is, when a leading-out electrode of the micro light-emitting diode is bound to a contact electrode, the adhesive used between the leading-out electrode and the contact electrode is not easy to be completely discharged to the outside of the contact electrode, so that the binding effect of the micro light-emitting diode and the driving backplane is poor.

SUMMARY

An embodiment of the disclosure provides a driving backplane, a display panel and a display device to solve the problem of poor binding effect of the micro light-emitting diode and the driving backplane in the related art.

In a first aspect, an embodiment of the present disclosure provides a driving backplane, including: a base substrate, a driving circuit arranged on the base substrate, an insulation layer on a side of the driving circuit facing away from the base substrate, a plurality of first tip structures arranged on a side of the insulation layer facing away from the base substrate, and a plurality of contact electrodes arranged on the side of the insulation layer facing away from the base substrate; the driving circuit includes a plurality of output terminals, the insulation layer includes a plurality of openings, and there is a one-to-one correspondence between the output terminals and the openings, and the contact electrodes are electrically connected with the output terminals through the openings. Each of the contact electrodes includes a plurality of second tip structures, and each of the second tip structures is configured to cover one of the first tip structures.

In a possible implementation manner, in the above driving backplane provided by the embodiment of the present disclosure, the contact electrode is an integral structure arranged on a side of a film layer where the first tip structures are located, facing away from the base substrate.

In an optional implementation manner, in the above driving backplane provided by the embodiment of the present disclosure, the contact electrode further includes: a planar portion located between the insulation layer and the first tip structures. The planar portion is electrically connected with each of the second tip structures belonging to the same contact electrode, respectively.

In an optional implementation manner, in the above driving backplane provided by the embodiment of the present disclosure, each of the second tip structures corresponding to the same contact electrode are arranged along a plurality of straight lines crossing each other.

In an optional implementation manner, in the above driving backplane provided by the embodiment of the present disclosure, some of the second tip structures corresponding to the same contact electrode are distributed on a circle or concentric circle with one of the second tip structures being located at a center.

In an optional implementation manner, in the above driving backplane provided by the embodiment of the present disclosure, the second tip structure is a cone or a pyramid.

In an optional implementation manner, in the above driving backplane provided by the embodiment of the present disclosure, a height of the second tip structure in a direction perpendicular to the base substrate is within a range of 1 μm~3 μm, and the maximum width of a bottom surface of the second tip structure is within a range of 1 μm~3 μm.

In an optional implementation manner, in the above driving backplane provided by the embodiment of the present disclosure, the driving circuit includes: a plurality of thin film transistors and a plurality of power supply voltage signal lines arranged on the base substrate. The contact electrodes are divided into a first contact electrode and a second contact electrode. The first contact electrode is electrically connected with a drain electrode of the thin film transistor, and the second contact electrode is electrically connected with the power supply voltage signal line.

In a second aspect, an embodiment of the present disclosure provides a display panel, including: the driving backplane described above and a plurality of micro light-emitting diodes. A leading-out electrode of the micro light-emitting diode is bound to the contact electrode of the driving backplane.

In a third aspect, an embodiment of the present disclosure provides a display device including the display panel described above.

Beneficial effects of the present disclosure are described below.

The embodiments of the present disclosure provide a driving backplane, a display panel and a display device. The driving backplane includes: a base substrate, a driving circuit arranged on the base substrate, an insulation layer on the side of the driving circuit facing away from the base substrate, a plurality of first tip structures arranged on the side of the insulation layer facing away from the base substrate, and a plurality of contact electrodes arranged on the side of the insulation layer facing away from the base substrate; where the driving circuit has a plurality of output terminals, the insulation layer has a plurality of openings and there is a one-to-one correspondence between the out terminals and the openings, and the contact electrodes are electrically connected with the output terminals through the openings; the contact electrodes cover the plurality of first tip structures to constitute a plurality of second tip structures having the same appearance as the first tip structures. In the above driving backplane provided by the embodiment of the present disclosure, the surface of the contact electrode is formed with a plurality of second tip structures, so that the adhesive is smoothly discharged outward when the leading-out electrode of the micro light-emitting diode is bound to the contact electrode. Therefore, the leading-out electrode can be in good contact with the contact electrode, and the binding effect is improved.

DETAILED DESCRIPTION

In view of the problem in the related art that the binding effect of the micro light-emitting diode and the driving backplane is poor, embodiments of the present disclosure provide a driving backplane, a display panel and a display device.

Specific embodiments of a driving backplane, a display panel and a display device provided by embodiments of the present disclosure will be described in detail below with reference to the accompanying drawings. The thickness and shape of each film layer in the accompanying drawings do not reflect an actual scale and are only intended to illustrate the content of the present disclosure.

Figure 1:
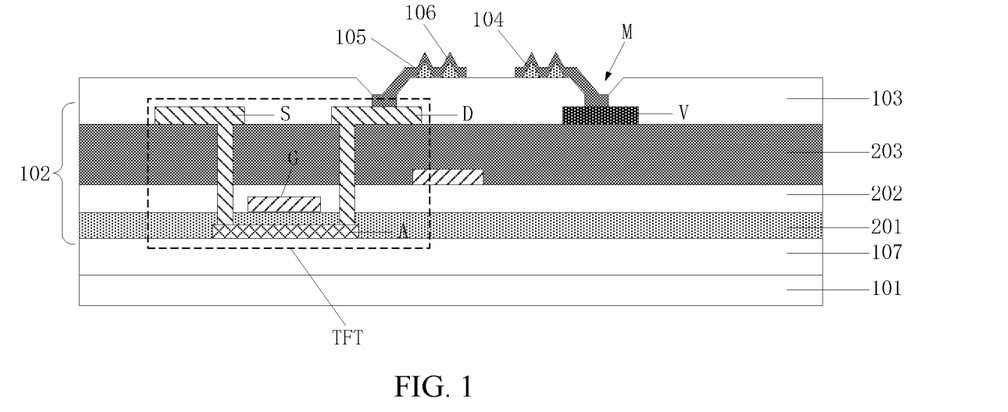
FIG. 1 is a schematic structural diagram I of a driving backplane provided by an embodiment of the present disclosure.

In a first aspect, an embodiment of the present disclosure provides a driving backplane. As shown in FIG. 1, the driving backplane includes: a base substrate 101, a driving circuit 102 arranged on the base substrate 101, an insulation layer 103 arranged on a side of the driving circuit 102 facing away from the base substrate 101, a plurality of first tip structures 104 arranged on a side of the insulation layer 103 facing away from the base substrate 101, and a plurality of contact electrodes 105 arranged on the side of the insulation layer 103 facing away from the base substrate 101.

The driving circuit 102 includes a plurality of output terminals (for example, one of the output terminals is located at a position where the contact electrode 105 is contact with the drain electrode D), the insulation layer 103 includes a plurality of openings M. The openings M and the output terminals are in a one-to-one correspondence. The contact electrode 105 is electrically connected with the output terminal through the opening M.

The contact electrode 105 covers the plurality of first tip structures 104 to constitute a plurality of second tip structures 106 having the same appearance as the first tip structures 104.

In the above driving backplane provided by the embodiment of the present disclosure, the surface of the contact electrode is formed with a plurality of second tip structures, so that the adhesive is smoothly discharged outward when the leading-out electrode of the micro light-emitting diode is bound to the contact electrode. Therefore, the leading-out electrode can be in good contact with the contact electrode, and the binding effect is improved.

As shown in FIG. 1, the plurality of first tip structures 104 are provided on the side of the insulation layer 103 facing away from the base substrate base 101, after the plurality of first tip structures 104 is covered by the contact electrode 105, the second tip structures 106 having the same appearance as the first tip structures 104 are formed, and the second tip structures 106 are a part of the contact electrode 105. Accordingly, the second tip structure 106 is electrically connected with the output terminal of the driving circuit 102. Therefore, in the binding process, as long as the second tip structure 106 punctures the adhesive, direct contact electrical connection between the leading-out electrode of the micro light-emitting diode and the contact electrode can be achieved.

The micro light-emitting diode has a very small size, and the leading-out electrode of the micro light-emitting diode is on the order of micrometers. Accordingly, the size of the contact electrode of the driving backplane is about 25 μm×25 μm. In the binding process of the leading-out electrode of the micro light-emitting diode and the contact electrode, an adhesive, which is generally a non-conductive adhesive, is required to be dripped to the surface of the contact electrode, so as to adhere the leading-out electrode to the contact electrode. Then, in a manner that a side of the micro light-emitting diode with the leading-out electrode faces the driving backplane, the leading-out electrode is aligned to a corresponding contact electrode and pressed against the contact electrode. When the leading-out electrode and the corresponding contact electrode are pressed against each other, the second tip structure may puncture the adhesive to realize the contact between the leading-out electrode and the contact electrode, and the leading-out electrode can be fixed on the contact electrode through the adhesive. In this way, the binding connection of the leading-out electrode and the contact electrode is realized, and excess adhesive may be discharged along a gap between the second tip structures to avoid the contact effect between the leading-out electrode and the contact electrode being influenced by the excess adhesive. Therefore, the binding effect between the micro light-emitting diode and the driving backplane is improved.

In an actual implementation, the second tip structures in the contact electrode may also be elastic. Therefore, after the binding connection of the micro light-emitting diode and the contact electrode is achieved by pressing, the contact area between the second tip structures and the leading-out electrode may be increased.

Optionally, the above driving backplane provided by the embodiment of the present disclosure is bound to the micro light-emitting diode. The micro light-emitting diode generally has two leading-out electrodes, namely an anode and a cathode, and the two leading-out electrodes may be arranged on the same side of an epitaxial structure or on different sides of the epitaxial structure. In practical application, the structure of the driving backplane may be configured according to the structure of the micro-light emitting diode to be bound. For example, the driving backplane as shown in FIG. 1 may be bound to a micro-light emitting diode with two leading-out electrodes arranged on the same side of the epitaxial structure.

Specifically, in the above driving backplane provided by the embodiment of the present disclosure, as shown in FIG. 1, the driving circuit 102 includes: a plurality of thin film transistors TFT and a plurality of power supply voltage signal lines V arranged on the base substrate 101. The contact electrode 105 is divided into a first contact electrode and a second contact electrode. The first contact electrode is electrically connected with a drain electrode D of the thin film transistor TFT, and the second contact electrode is electrically connected with the power supply voltage signal line V. The first contact electrode is electrically connected with the drain electrode D through an opening M, in which the position where the first contact electrode is in contact with the drain electrode D is the output terminal of the driving circuit. The second contact electrode is electrically connected with the power voltage signal line V through an opening M, in which the position where the second contact electrode is in contact with the power voltage signal line V is also the output terminal of the driving circuit.

Specifically, the thin film transistor TFT includes an active layer A, a gate electrode G, a source electrode S, a drain electrode D and the like. The power supply voltage signal line V may be a Vss signal line. Only one thin film transistor TFT and one power supply voltage signal line V are shown in FIG. 1. However, in actual implementation, the number of the thin film transistors TFT and the number of the power supply voltage signal lines V may be configured according to actual needs, which are not limited herein.

As shown in FIG. 1, a buffer layer 107 is further provided between the driving circuit 102 and the base substrate 101. In the thin film transistor TFT, a first gate insulation layer 201 is provided between the active layer A and the gate electrode G, a second gate insulation layer 202 and an interlayer insulation layer 203 are further provided between the gate electrode G and the source electrode S. The source electrode S and the drain electrode D are electrically connected with the active layer A through through-holes penetrating through the first gate insulation layer 201, the second gate insulation layer 202 and the interlayer insulation layer 203, respectively.

In the actual implementation, in the above driving backplane provided by the embodiment of the present disclosure, the surface of the contact electrode may be formed with a plurality of second tip structures by adopting at least the following two structures.

Structure I:

As shown in FIG. 1, the contact electrode 105 is an integral structure arranged on a side of a film layer where the first tip structure 104 is located facing away from the base substrate 101.

Figure 2A:
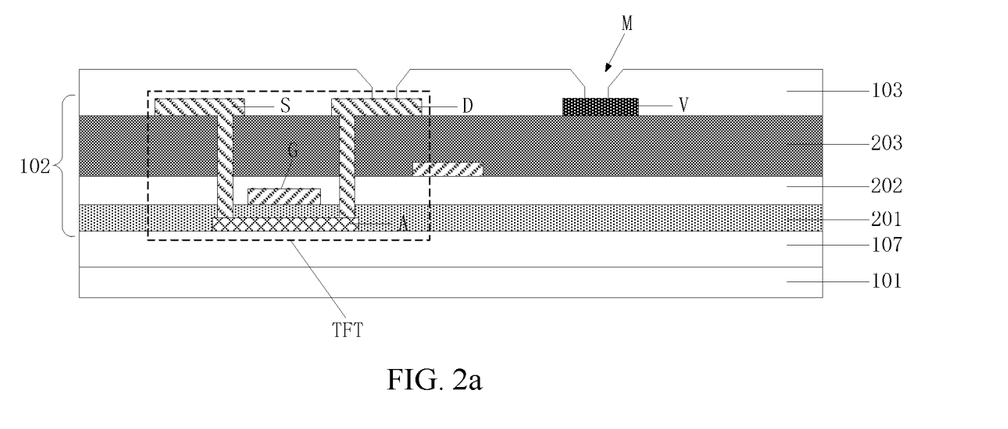
FIGS. 2a and 2b are schematic structural diagrams of the structure shown in FIG. 1 during a fabrication process.
Figure 2B:
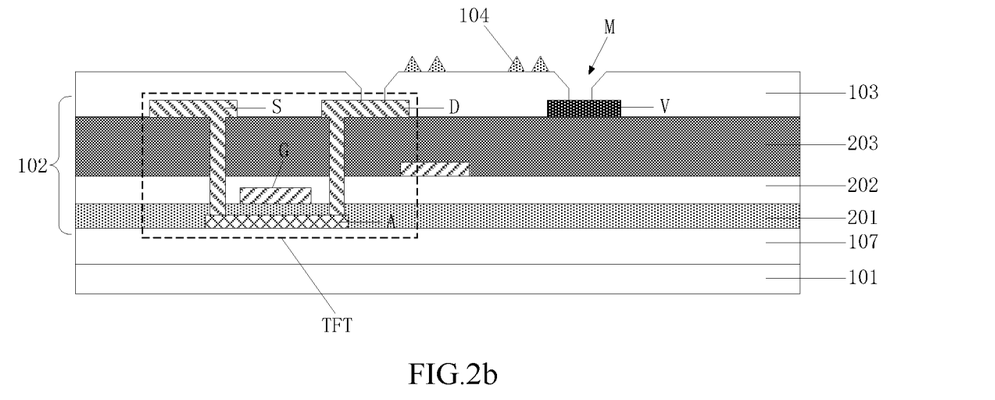

Specifically, in a manufacturing process of the above driving backplane, as shown in FIG. 2a, the buffer layer 107, each film layer of the thin film transistor TFT, and the insulation layer 103 are patterned on the base substrate 101. As shown in FIG. 2b, a plurality of first tip structures 104 are formed on the insulation layer 103 at positions where contact electrodes are to be formed later, for example, the first tip structures 104 may be made of an organic material. Next, a metal layer is deposited on the film layer where the first tip structures 104 are located. Referring to FIG. 1, the metal layer forms a plurality of second tip structures 106 at positions of the first tip structures 104, and is patterned, to form the plurality of contact electrodes 105, thereby obtaining the structure as shown in FIG. 1. Specifically, the metal layer may be formed by laminating an aluminum (Al) metal layer and a titanium (Ti) metal layer. The aluminum metal layer has a high conductivity, so that a good conductivity between the formed contact electrode and the lead-out electrode may be ensured. The titanium metal layer has a high hardness and may be used as a supporter.

Figure 3:
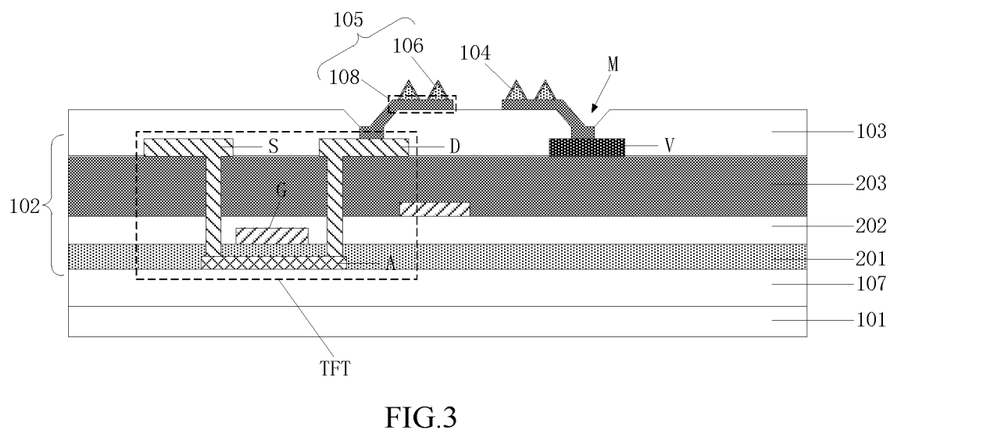
FIG. 3 is a schematic structural diagram II of a driving backplane provided by an embodiment of the present disclosure.

Structure II:

As shown in FIG. 3, the contact electrode 105 further includes: a planar portion 108 arranged between the insulation layer 103 and the film layer where the first tip structures 104 are located. The planar portion 108 is electrically connected with each of the second tip structures 106 belonging to the same contact electrode 105, respectively.

In contact electrode 105, the planar portion 108 is electrically connected with each of the second tip structures 106 respectively, so that the electrical connection between the second tip structure 106 and the output terminal of the driving circuit can be achieved through the planar portion 108. Therefore, it is ensured that the leading-out electrode is bound to the contact electrode 105 by being in contact with the second tip structure 106 subsequently.

Figure 4A:
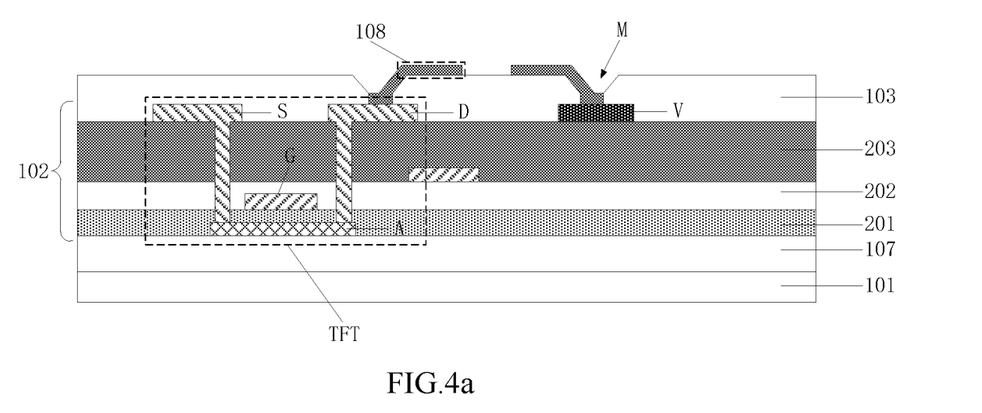
FIGS. 4a and 4b are schematic structural diagrams of the structure shown in FIG. 3 during a fabrication process.
Figure 4B:
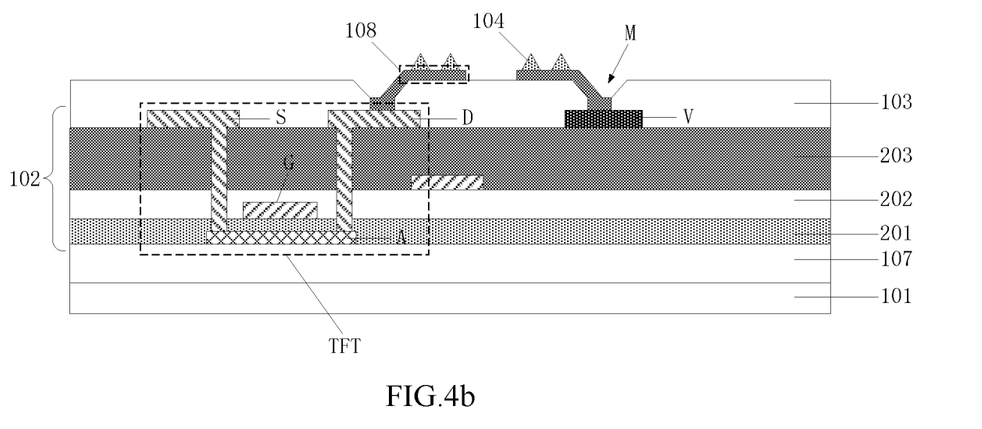

Specifically, in the manufacturing process of the above driving backplane, as shown in FIG. 4a, a metal layer is formed on the insulation layer 103 and patterned to form the planar portions 108 of a plurality of contact electrodes, and the planar portions 108 are electrically connected with the corresponding output terminals through the openings M. Next, as shown in FIG. 4b, a plurality of first tip structures 104 are formed on the planar portions 108, and then a plurality of metal structures are formed on the film layer of the first tip structures 104 at positions corresponding to the planar portions 108, respectively, to form a plurality of second tip structures, thereby obtaining the structure as shown in FIG. 3, that is, each metal structure covers each of the first tip structures 104 corresponding to one planar portion 108, so that the patterning process of the metal structure can be simplified. Specifically, similar to the metal layer in Structure I, the metal structure may also be formed by laminating an aluminum (Al) metal layer and a titanium (Ti) metal layer, and the thickness of the metal structure may be less than the thickness of the metal layer in Structure I.

Figure 5:
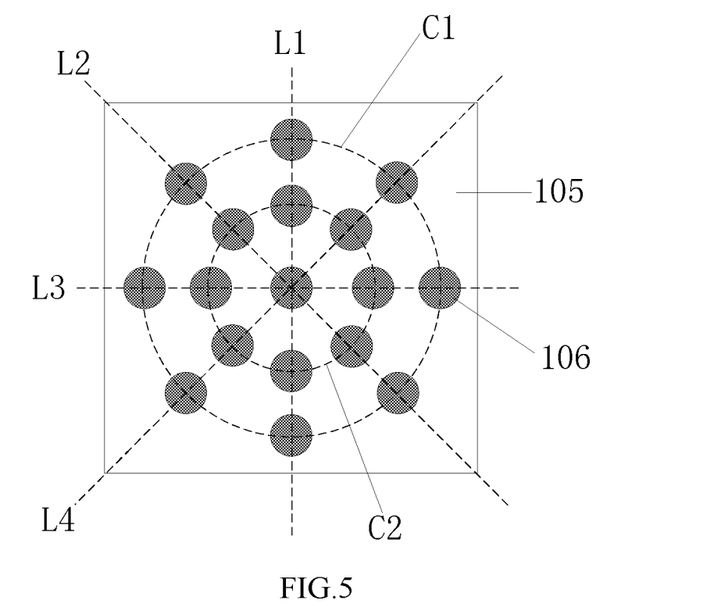
FIG. 5 is a schematic diagram of a distribution of the second tip structures corresponding to one contact electrode.
Figure 6:
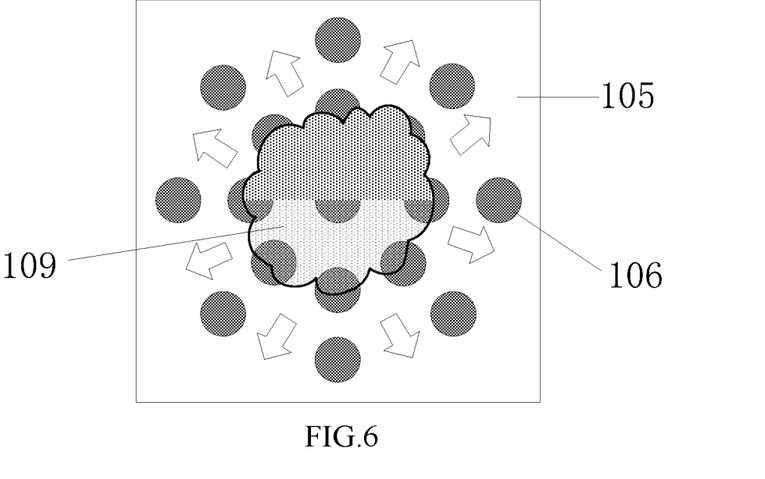
FIG. 6 is a schematic diagram of an adhesive discharge process.

Further, for the above driving backplane provided by the embodiment of the present disclosure, FIG. 5 is a schematic diagram illustrating the distribution of the second tip structures corresponding to the same contact electrode, FIG. 6 is a schematic diagram of an adhesive discharge process. In FIG. 5 and FIG. 6, positions of the second tip structures are represented by circles without limiting the shapes of the second tip structures. As shown in FIG. 5, the second tip structures 106 corresponding to the same contact electrode 105 are arranged along a plurality of straight lines crossing each other. In FIG. 5, as an example, the second tip structures 106 of the same contact electrode 105 are arranged along straight lines L1, L2, L3 and L4 crossing each other. However, in the actual implementation, the second tip structures 106 may also be arranged according to the number and size of the second tip structures 106 of the contact electrode 105, and the number of the straight lines in which the second tip structures 106 are arranged is not limited herein.

Since the second tip structures 106 corresponding to the same contact electrode 105 are arranged along a plurality of straight lines crossing each other, in the binding process, referring to FIG. 6, after the adhesive is dropped to the surface of the contact electrode 105 and then the micro light-emitting diode and the contact electrode 105 are pressed against each other, the adhesive 109 may be discharged outward along the gap between the second tip structures 106 arranged in the straight line. The direction indicated by the arrow in FIG. 6 is the direction in which the adhesive is discharged outward. The adhesive 109 is not subjected to a restraining force during the discharge process. Further, since the second tip structures 106 are arranged in a straight line, the adhesive 109 does not squeeze the second tip structures 106 during the discharge process, and the second tip structures 106 are prevented from being damaged.

In a specific implementation, when the micro light-emitting diode and the contact electrode 105 are pressed against each other, the amount of the adhesive discharged in various directions is relatively uniform, and an included angle between adjacent straight lines formed by the second tip structures 106 may be the same, for example, an included angle between the straight lines L1 and L2 in the drawing is the same as an included angle between the straight lines L3 and L4.

Further, for the above driving backplane provided by the embodiment of the present disclosure, as shown in FIG. 5, among the second tip structures 106 corresponding to the same contact electrode 105, one of the second tip structures is arranged at a center, and the remaining second tip structures 106 are uniformly distributed on at least one concentric circle. In FIG. 5, with the second tip structure 106 in the middle as the center, the remaining second tip structures 106 are arranged on a circle C1 and a circle C2, the circles C1 and C2 are concentric circles. As an example, the second tip structures 106 are arranged on two concentric circle in the drawing. However, in practical application, the second tip structures 106 may also be arranged according to the number and size of the second tip structures 106 of the contact electrode 105, and the number of the concentric circles on which the second tip structures 106 are arranged is not limited herein.

Referring to FIG. 6, the second tip structures 106 of the contact electrode 105 are arranged on at least one concentric circle, so that the resistance of the adhesive 109 in various directions is substantially consistent during the outward diffusion process, facilitating the adhesive to spread outward uniformly.

Figure 7:
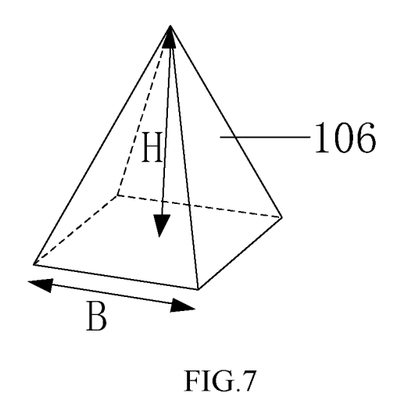
FIG. 7 is a schematic diagram of one of the second tip structures.
Figure 8:
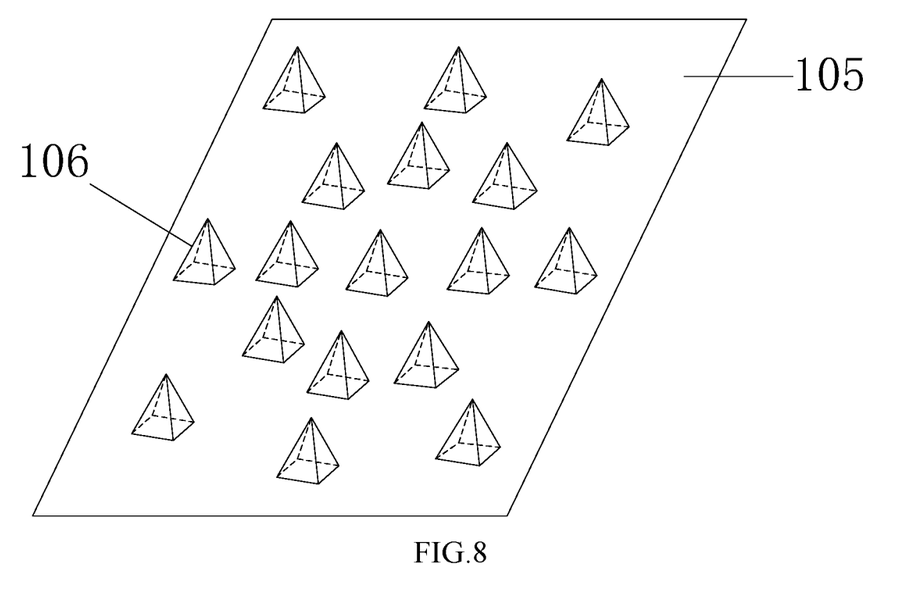
FIG. 8 is a schematic structural diagram of a contact electrode obtained by arranging the second tip structures shown in FIG. 7 according to the arrangement shown in FIG. 5.

In a specific implementation, in the driving backplane provided by the embodiment of the present disclosure, the second tip structure is a cone or a pyramid (as shown in FIG. 7). When the second tip structure is a pyramid, a schematic top view of the corresponding contact electrode can be as shown in FIG. 8, and as is apparent from FIG. 8, the second tip structures 106 are arranged according to the arrangement shown in FIG. 5. In addition, the second tip structure may also have other shapes, which is not limited herein.

Specifically, in the driving backplane provided by the embodiment of the present disclosure, as shown in FIG. 7, a height H of the second tip structure 106 in a direction perpendicular to the base substrate is within a range of 1 µm~3 µm. The maximum width B of a bottom surface of the second tip structure 106 is within a range of 1 µm~3 µm. As shown in FIG. 7, when the second tip structure 106 is a pyramid, the maximum width B of the bottom surface of the second tip structure 106 is the bottom surface side length, and when the second tip structure 106 is a cone, the maximum width of the bottom surface of the second tip structure 106 is the bottom surface diameter. Generally, the size of the contact electrode 105 is about 25 µm×25 µm. Therefore, in order to ensure that the contact electrode has enough second tip structures, the maximum width of the bottom surface of the second tip structure is controlled within the range of 1 µm~3 µm. For example, as shown in FIG. 8, the contact electrode 105 has 17 second tip structures 106, so as to ensure the conductivity between the leading-out electrode of the micro light-emitting diode and the contact electrode and ensure the binding effect.

In a second aspect, based on the same concept, embodiments of the present disclosure provide a display panel. Since the display panel and the driving backplane adopt the same principle for solving the problem, the implementation of the display panel may refer to the implementation of the driving backplane, and thus the description is not repeated herein.

Specifically, the display panel provided in the embodiment of the present disclosure includes: the driving backplane described above and a plurality of micro light-emitting diodes. A leading-out electrode of the micro light-emitting diode is bound to the contact electrode of the driving backplane.

The leading-out electrode of the micro light-emitting diode is electrically connected with the contact electrode through direct contact, and the leading-out electrode and the contact electrode are adhered through adhesive so as to realize the binding connection between the leading-out electrode and the contact electrode.

In a third aspect, based on the same concept, embodiments of the present disclosure provide a display device including the display panel described above. The display device may be applied to any product or component having a display function, such as a mobile phone, a tablet computer, a television, a display, a notebook computer, a digital photo frame and a navigator and the like. Since the display device and the display panel described above have the same principle for solving the problem, the implementation of the display device may refer to the implementation of the display panel, and thus the description is not repeated herein.

In the above driving backplane, display panel and display device provided by the embodiments of the present disclosure, the surface of the contact electrode is formed with a plurality of second tip structures, thus the adhesive is smoothly discharged outward when the leading-out electrode of the micro light-emitting diode is bound to the contact electrode. Therefore, the leading-out electrode is in good contact with the contact electrode, and the binding effect is improved.

It is apparent to those skilled in the art to make various modifications and variations to the disclosure without departing from the spirit and scope of the present disclosure. In this way, if these modifications and variations belong to the scope of the claims of the disclosure and their equivalents, then the disclosure is intended to cover these modifications and variations.

What is claimed is:

1. A driving backplane, comprising: a base substrate, a driving circuit arranged on the base substrate, an insulation layer on a side of the driving circuit facing away from the base substrate, a plurality of first tip structures arranged on a side of the insulation layer facing away from the base substrate, and a plurality of contact electrodes arranged on the side of the insulation layer facing away from the base substrate; wherein the driving circuit comprises a plurality of output terminals, the insulation layer comprises a plurality of openings, the output terminals and the openings are in a one-to-one correspondence, and the contact electrodes are electrically connected with the output terminals through the openings; and each of the contact electrodes comprises a plurality of second tip structures, wherein each of the second tip structures is configured to cover one of the first tip structures;

wherein the second tip structures corresponding to the same contact electrode are arranged along a plurality of straight lines crossing each other, wherein some of the second tip structures corresponding to the same contact electrode are distributed on at least one concentric circle with one of these second tip structures being arranged at a center of the concentric circle.

2. The driving backplane according to claim 1, wherein each of the contact electrodes is an integral structure arranged on a side of a film layer where the first tip structures are located facing away from the base substrate.

3. The driving backplane according to claim 1, wherein each of the contact electrodes further comprises: a planar portion located between the insulation layer and the first tip structures;
wherein the planar portion is electrically connected with each of the second tip structures belonging to the same contact electrode, respectively.

4. The driving backplane according to claim 1, wherein each of the second tip structures is a cone or a pyramid.

5. The driving backplane according to claim 4, wherein a height of each of the second tip structures in a direction perpendicular to the base substrate is within a range of 1 μm~3 μm; and
a maximum width of a bottom surface of each of the second tip structures is within a range of 1 μm~3 μm.

6. The driving backplane according to claim 1, wherein the driving circuit comprises: a plurality of thin film transistors and a plurality of power supply voltage signal lines arranged on the base substrate;
wherein each of the contact electrode is divided into a first contact electrode and a second contact electrode;
wherein the first contact electrode is electrically connected with a drain electrode of one of the thin film transistors, and the second contact electrode is electrically connected with the one of the power supply voltage signal lines.

7. A display panel, comprising: a driving backplane and a plurality of micro light-emitting diodes;
wherein the driving backplane comprises: a base substrate, a driving circuit arranged on the base substrate, an insulation layer on a side of the driving circuit facing away from the base substrate, a plurality of first tip structures arranged on a side of the insulation layer facing away from the base substrate, and a plurality of contact electrodes arranged on the side of the insulation layer facing away from the base substrate; wherein the driving circuit comprises a plurality of output terminals, the insulation layer comprises a plurality of openings, the output terminals and the openings are in a one-to-one correspondence, and the contact electrodes are electrically connected with the output terminals through the openings; and each of the contact electrodes comprises a plurality of second tip structures, wherein each of the second tip structures is configured to cover one of the first tip structures;
wherein a leading-out electrode of each of the micro light-emitting diodes is bound to the contact electrodes of the driving backplane;
wherein the second tip structures corresponding to the same contact electrode are arranged along a plurality of straight lines crossing each other,
wherein some of the second tip structures corresponding to the same contact electrode are distributed on at least one concentric circle with one of these second tip structures being arranged at a center of the concentric circle.

8. The display panel according to claim 7, wherein each of the contact electrodes is an integral structure arranged on a side of a film layer where the first tip structures are located facing away from the base substrate.

9. The display panel according to claim 7, wherein each of the contact electrodes further comprises: a planar portion located between the insulation layer and the first tip structures;
wherein the planar portion is electrically connected with each of the second tip structures belonging to the same contact electrode, respectively.

10. The display panel according to claim 7, wherein each of the second tip structures is a cone or a pyramid.

11. The display panel according to claim 10, wherein a height of each of the second tip structures in a direction perpendicular to the base substrate is within a range of 1 μm~3 μm; and
a maximum width of a bottom surface of each of the second tip structures is within a range of 1 μm~3 μm.

12. The display panel according to claim 7, wherein the driving circuit comprises: a plurality of thin film transistors and a plurality of power supply voltage signal lines arranged on the base substrate;
wherein each of the contact electrode is divided into a first contact electrode and a second contact electrode;
wherein the first contact electrode is electrically connected with a drain electrode of one of the thin film transistors, and the second contact electrode is electrically connected with the one of the power supply voltage signal lines.

13. A display device comprising a display panel, wherein the display panel comprises a driving backplane and a plurality of micro light-emitting diodes;
wherein the driving backplane comprises: a base substrate, a driving circuit arranged on the base substrate, an insulation layer on a side of the driving circuit facing away from the base substrate, a plurality of first tip structures arranged on a side of the insulation layer facing away from the base substrate, and a plurality of contact electrodes arranged on the side of the insulation layer facing away from the base substrate; wherein the driving circuit comprises a plurality of output terminals, the insulation layer comprises a plurality of openings, the output terminals and the openings are in a one-to-one correspondence, and the contact electrodes are electrically connected with the output terminals through the openings; and each of the contact electrodes comprises a plurality of second tip structures, wherein each of the second tip structures is configured to cover one of the first tip structures;
wherein a leading-out electrode of each of the micro light-emitting diodes is bound to the contact electrodes of the driving backplane;
wherein the second tip structures corresponding to the same contact electrode are arranged along a plurality of straight lines crossing each other,
wherein some of the second tip structures corresponding to the same contact electrode are distributed on at least one concentric circle with one of these second tip structures being arranged at a center of the concentric circle.

* * * * *